United States Patent
Kim et al.

(10) Patent No.: US 9,817,132 B2
(45) Date of Patent: Nov. 14, 2017

(54) DIGITAL X-RAY DETECTOR

(71) Applicant: Hydis Technologies Co., Ltd., Gyeonggi-do (KR)

(72) Inventors: Seongsu Kim, Gyeonggi-do (KR); Jong Ho Jang, Seoul (KR)

(73) Assignee: Hydis Technologies Co., Ltd (KR)

(*) Notice: Subject to any disclaimer, the term of this patent is extended or adjusted under 35 U.S.C. 154(b) by 187 days.

(21) Appl. No.: 14/701,085

(22) Filed: Apr. 30, 2015

(65) Prior Publication Data

US 2016/0223691 A1    Aug. 4, 2016

(30) Foreign Application Priority Data

Jan. 29, 2015  (KR) .................. 10-2015-0014356

(51) Int. Cl.
*G01T 1/20* (2006.01)
*H01L 27/146* (2006.01)

(52) U.S. Cl.
CPC ...... *G01T 1/2018* (2013.01); *H01L 27/14603* (2013.01); *H01L 27/14612* (2013.01); *H01L 27/14663* (2013.01); *H01L 27/14692* (2013.01)

(58) Field of Classification Search
CPC .. G01T 1/241; G01T 1/2018; H01L 27/14658
USPC ...................................................... 250/369
See application file for complete search history.

(56) References Cited

U.S. PATENT DOCUMENTS

| 4,700,074 A * | 10/1987 | Bosnjakovic | ......... G01T 1/1642 250/363.02 |
| 6,627,897 B1 * | 9/2003 | Francke | .................. G01T 1/185 250/374 |
| 6,670,599 B2 * | 12/2003 | Wagner | .................. H01L 31/12 250/214.1 |
| 2014/0231804 A1 * | 8/2014 | Yan | ..................... H01L 27/1214 257/53 |

FOREIGN PATENT DOCUMENTS

| DE | EP 0262365 A2 * | 4/1988 | ............. G01R 29/24 |
| KR | 10-2010-0082631 A | 7/2010 | |
| KR | 10-2011-0067818 A | 6/2011 | |

OTHER PUBLICATIONS

Derwent Version of EP 0262365 A2—English Abstract.*

* cited by examiner

*Primary Examiner* — David Porta
*Assistant Examiner* — Abra Fein
(74) *Attorney, Agent, or Firm* — Mayback & Hoffman, P.A.; Gregory L. Mayback

(57) ABSTRACT

A digital x-ray detector comprises a substrate, gate and data lines on the substrate to have the lines intersect each other to form a pixel domain, a thin film transistor within the pixel domain and adjacent to a portion where the gate and data lines intersect each other, the thin film transistor including gate, source, and drain electrodes and an active layer, a PIN diode within the pixel domain and including a lower electrode connected to the source electrode of the thin film transistor, a PIN layer on the lower electrode, and an upper electrode on the PIN layer, a bias line connected to the upper electrode of the PIN diode, and a scintillator disposed above the PIN diode. An aperture hole is formed on a plate surface of the upper electrode to transmit a visible ray from the scintillator directly towards the PIN layer.

3 Claims, 5 Drawing Sheets

DIGITAL X-RAY DETECTOR

CROSS-REFERENCE TO RELATED APPLICATIONS

This application claims the benefit of priority under 35 U.S.C. §§119 and 371 of Korean Patent Application No. 10-2015-0014356, filed on Jan. 29, 2015, in the Korean Intellectual Property Office, the entire disclosure of which is incorporated herein by reference for all purposes.

STATEMENT REGARDING FEDERALLY SPONSORED RESEARCH OR DEVELOPMENT

Not Applicable

FIELD OF THE INVENTION

The present systems and methods lies in the field of x-ray detectors. The present disclosure relates to a digital x-ray detector with improved reaction velocity and photo-electron signal conversion efficiency of a PIN diode.

BACKGROUND OF THE INVENTION

Methods for detecting an x-ray include a method of directly detecting an x-ray and a method of indirectly detecting an x-ray by converting the x-ray into a visible ray and then detecting the x-ray using the visible ray.

An x-ray detector using the aforementioned indirect method includes an element to convert an x-ray into a visible ray, an element to convert the visible ray into an electronic signal, and an element to convert the electronic signal into an image signal. In other words, the x-ray detector using the indirect method is an apparatus configured to convert an emitted x-ray eventually into an image signal.

A conventional digital x-ray detector (hereinafter referred to as a 'digital x-ray detector') will be explained with reference to the drawings attached.

FIG. 1 is a schematic cross-sectional view illustrating a conventional digital x-ray detector and FIG. 2 is a schematic top view of the conventional digital x-ray detector. As illustrated in FIGS. 1 and 2, the conventional digital x-ray includes a substrate 10, a gate line 20 and a data line 30 disposed on the substrate 10 such that the gate line and the data line 30 intersect each other, a thin film transistor 40 formed on an intersecting region of the gate line 20 and the data line 30, a PIN diode 50 disposed on a pixel domain, a bias line 60 disposed above the PIN diode 50 such that it is parallel to the data line 30, and a scintillator 70.

The thin film transistor 40 is formed on the substrate 10, and includes a gate electrode 21, an active layer 41, a source electrode 42, and a drain electrode 43.

The PIN diode 50 includes a lower electrode 51 that is electrically connected to the thin film transistor 20, a PIN layer 52 that includes a P (Positive) type semiconductor layer, an I (Intrinsic) type semiconductor layer, and an N (Negative) type semiconductor layer successively deposited on the lower electrode 51, and an upper electrode 53 made of a transparent conductor such as ITO (Indium Tin Oxide).

The scintillator 70 is formed on the PIN diode 50 and serves to convert an x-ray into a visible ray.

Hereinafter, operations of such a conventional digital x-ray will be explained.

When an x-ray is emitted to the scintillator 70, the x-ray is converted into a visible ray in the scintillator 70, and then the visible ray is transmitted to the PIN diode 50. The visible ray transmitted to the PIN diode 50 is converted into an electronic signal in the PIN diode 50, and the converted electronic signal is converted into an image signal through the thin film transistor, and is then displayed.

A reaction velocity of the digital x-ray detector is determined by a capacitance of the PIN diode 50. Specifically, an area of the upper electrode 53 that forms the PIN diode 50 is closely related to the capacitance of the PIN diode 50. That is, the capacitance (C) of the PIN diode 50 is proportional to a dielectric constant ($\in$) of the dielectric and an area (A) of the lower electrode 51 and the upper electrode 53 and is inversely proportional to a distance (l) between the lower electrode 51 and the upper electrode 53.

However, a conventional PIN diode 50 is formed such that it fills most of a pixel domain defined by the gate line 20 and the data line 30. Therefore, as the area of the upper electrode 53 increases, the capacitance of the PIN diode 50 increases, and such increased capacitance becomes a reason for deteriorating the reaction velocity of the digital x-ray detector.

Furthermore, the visible ray being provided from the scintillator 70 towards the PIN diode 50 is partially absorbed or reflected according to material characteristics of the upper electrode 53 and, thus, does not reach the PIN layer 52 below the upper electrode 53, that is, there is a problem that the upper electrode 53 deteriorates photo-electron signal conversion efficiency of the PIN diode 50.

Thus, a need exists to overcome the problems with the prior art systems, designs, and processes as discussed above.

SUMMARY OF THE INVENTION

The systems and methods described provide a digital x-ray detector with improved reaction velocity and photo-electron signal conversion efficiency of a PIN diode that overcomes the hereinafore-mentioned disadvantages of the heretofore-known devices and methods of this general type.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A purpose of the present disclosure is to resolve the aforementioned problems of prior art, that is to provide a digital x-ray detector with reduced capacitance and improved reaction velocity of a PIN diode.

Another purpose of the present disclosure is to provide a digital x-ray detector with improved photo-electron signal conversion efficiency due to increased amount of ray being provided to a PIN layer through a penetration hole formed an upper electrode.

With the foregoing and other objects in view, there is provided a digital x-ray detector comprising a substrate, a gate line and a data line formed on the substrate such that the gate line and the data line intersect each other to form a pixel domain, a thin film transistor formed within the pixel domain such that the thin film transistor is adjacent to a portion where the gate line and the data line intersect each other, the thin film transistor including a gate electrode, an active layer, a source electrode and a drain electrode, a PIN diode formed within the pixel domain and including a lower electrode connected to the source electrode of the thin film transistor, a PIN layer formed on the lower electrode, and an upper electrode formed on the PIN layer, a bias line connected to the upper electrode of the PIN diode, and a scintillator disposed above the PIN diode. An aperture hole is formed on a plate surface of the upper electrode to transmit a visible ray from the scintillator directly towards the PIN layer.

In accordance with another feature, the aperture hole may be formed in plural such that each hole is formed in a slit shape extending in one direction and the aperture holes are parallel to one another.

In accordance with a concomitant feature, the aperture hole may be formed in plural such that each hole is formed in a dot shape and the aperture holes are disposed in a matrix format.

Various aforementioned aspects of the present disclosure have an effect of providing a digital x-ray detector with reduced capacitance and improved reaction velocity of a PIN diode by forming a penetration hole on an upper electrode of the PIN diode.

Furthermore, there is also an effect of providing the digital x-ray detector with improved photo-electron signal conversion efficiency due to increased amount of ray being provided to a PIN layer through the penetration hole formed on the upper electrode.

Although the systems and methods are illustrated and described herein as embodied in a digital x-ray detector with improved reaction velocity and photo-electron signal conversion efficiency of a PIN diode, it is, nevertheless, not intended to be limited to the details shown because various modifications and structural changes may be made therein without departing from the spirit of the invention and within the scope and range of equivalents of the claims. Additionally, well-known elements of exemplary embodiments will not be described in detail or will be omitted so as not to obscure the relevant details of the systems and methods.

Additional advantages and other features characteristic of the systems and methods will be set forth in the detailed description that follows and may be apparent from the detailed description or may be learned by practice of exemplary embodiments. Still other advantages of the systems and methods may be realized by any of the instrumentalities, methods, or combinations particularly pointed out in the claims.

Other features that are considered as characteristic for the systems and methods are set forth in the appended claims. As required, detailed embodiments of the systems and methods are disclosed herein; however, it is to be understood that the disclosed embodiments are merely exemplary of the systems and methods, which can be embodied in various forms. Therefore, specific structural and functional details disclosed herein are not to be interpreted as limiting, but merely as a basis for the claims and as a representative basis for teaching one of ordinary skill in the art to variously employ the systems and methods in virtually any appropriately detailed structure. Further, the terms and phrases used herein are not intended to be limiting; but rather, to provide an understandable description of the systems and methods. While the specification concludes with claims defining the systems and methods of the invention that are regarded as novel, it is believed that the systems and methods will be better understood from a consideration of the following description in conjunction with the drawing figures, in which like reference numerals are carried forward.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the systems and methods. Advantages of embodiments of the systems and methods will be apparent from the following detailed description of the exemplary embodiments thereof, which description should be considered in conjunction with the accompanying drawings in which.

DETAILED DESCRIPTION OF THE INVENTION

Figure 1:
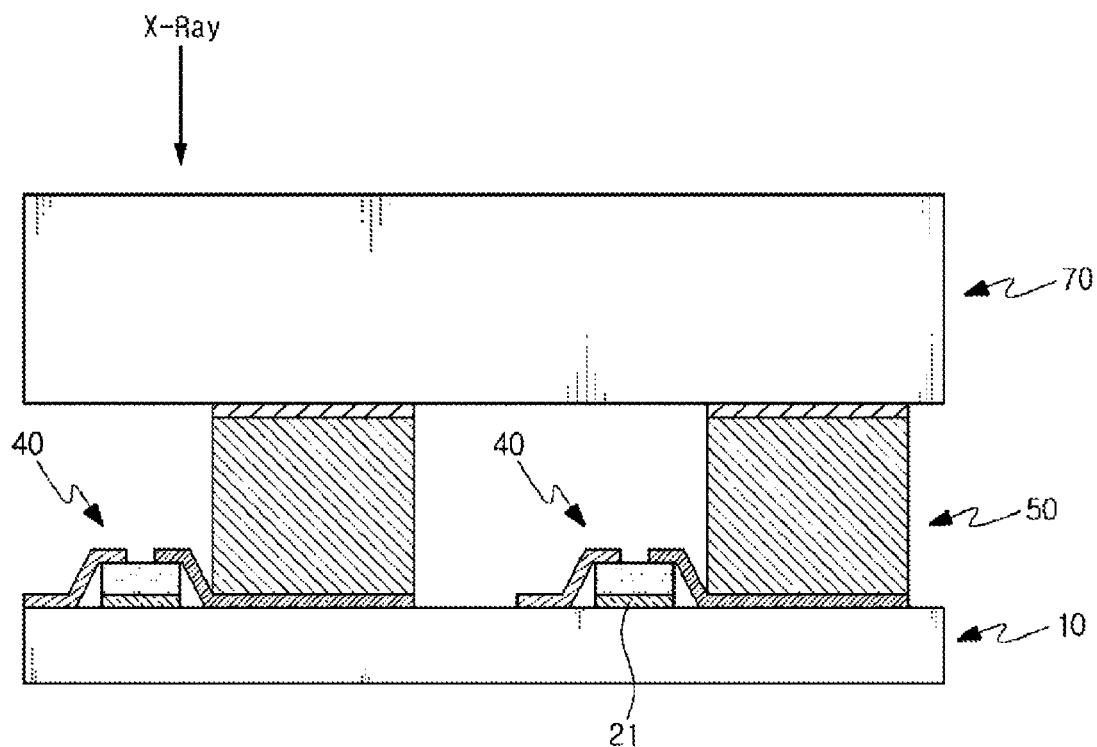
FIG. 1 is a fragmentary, schematic cross-sectional view illustrating a conventional digital x-ray detector.
Figure 2:
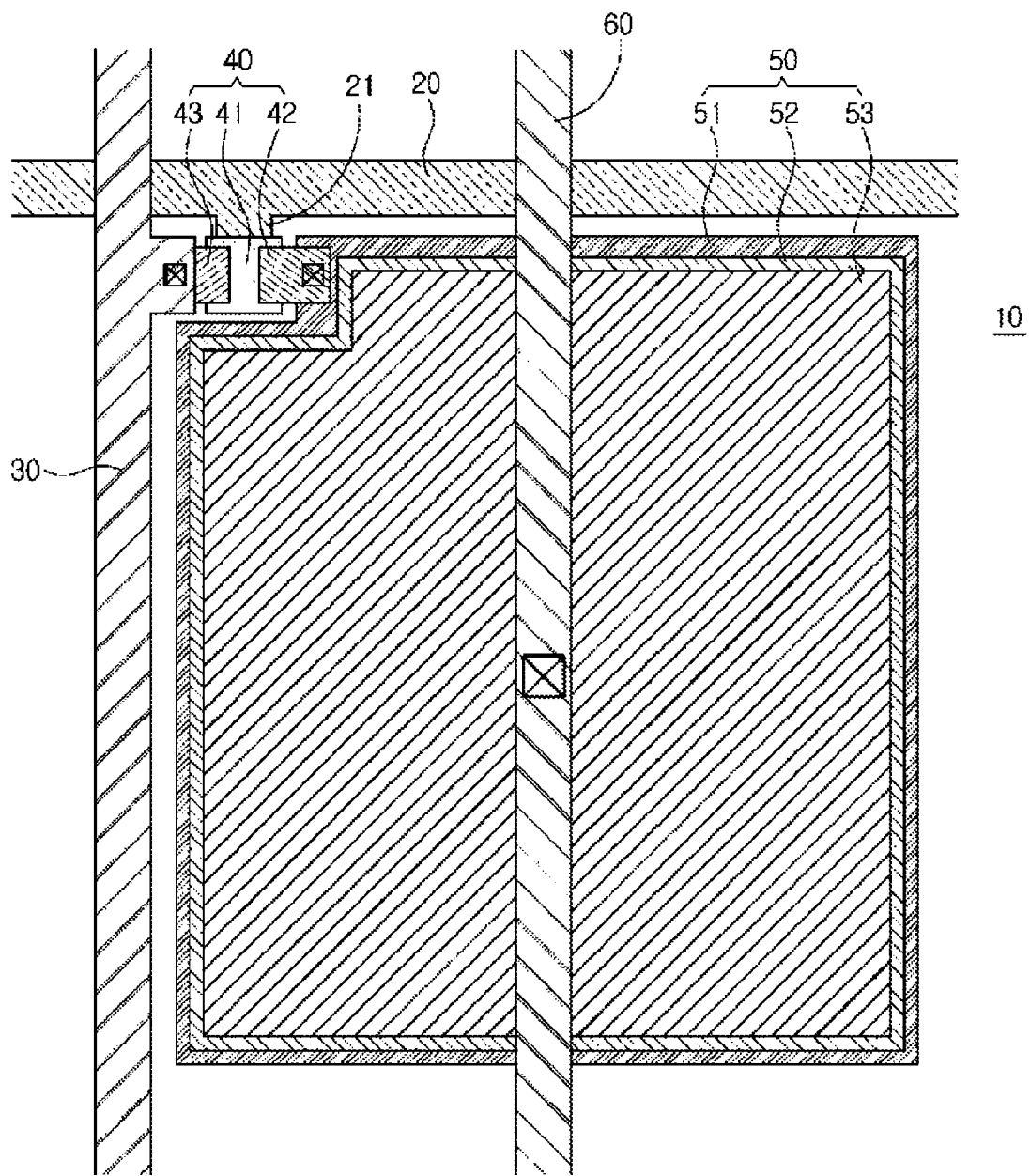
FIG. 2 is a fragmentary, schematic top plan view of the conventional digital x-ray detector of FIG. 1.

As required, detailed embodiments of the systems and methods are disclosed herein; however, it is to be understood that the disclosed embodiments are merely exemplary of the systems and methods, which can be embodied in various forms. Therefore, specific structural and functional details disclosed herein are not to be interpreted as limiting, but merely as a basis for the claims and as a representative basis for teaching one skilled in the art to variously employ the systems and methods in virtually any appropriately detailed structure. Further, the terms and phrases used herein are not intended to be limiting; but rather, to provide an understandable description of the systems and methods. While the specification concludes with claims defining the features of the systems and methods that are regarded as novel, it is believed that the systems and methods will be better understood from a consideration of the following description in conjunction with the drawing figures, in which like reference numerals are carried forward.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Alternate embodiments may be devised without departing from the spirit or the scope of the invention. Additionally, well-known elements of exemplary embodiments of the systems and methods will not be described in detail or will be omitted so as not to obscure the relevant details of the systems and methods.

Before the systems and methods are disclosed and described, it is to be understood that the terminology used herein is for the purpose of describing particular embodiments only and is not intended to be limiting. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element. The terms "including" and/or "having," as used herein, are defined as comprising (i.e., open language). The terms "a" or "an", as used herein, are defined as one or more than one. The term "plurality," as used herein, is defined as two or more than two. The term "another," as used herein, is defined as at least a second or more. The description may use the terms "embodiment" or "embodiments," which may each refer to one or more of the same or different embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact (e.g., directly coupled). However, "coupled" may also mean that two or more elements are not in direct contact with each other, but yet still cooperate or interact with each other (e.g., indirectly coupled).

For the purposes of the description, a phrase in the form "A/B" or in the form "A and/or B" or in the form "at least one of A and B" means (A), (B), or (A and B), where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables, for example, a phrase in the form "at least one of A, B, and C" means (A), (B), (C), (A and B), (A and C), (B and C), or (A, B and C).

Relational terms such as first and second, top and bottom, and the like may be used solely to distinguish one entity or action from another entity or action without necessarily requiring or implying any actual such relationship or order between such entities or actions. The description may use perspective-based descriptions such as up/down, back/front, and top/bottom. Such descriptions are merely used to facilitate the discussion and are not intended to restrict the application of disclosed embodiments. Various operations may be described as multiple discrete operations in turn, in a manner that may be helpful in understanding embodiments; however, the order of description should not be construed to imply that these operations are order dependent.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure.

Herein various embodiments of the systems and methods are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, a digital x-ray detector according to a first embodiment of the present disclosure will be explained in detail with reference to the drawings attached.

Figure 3:
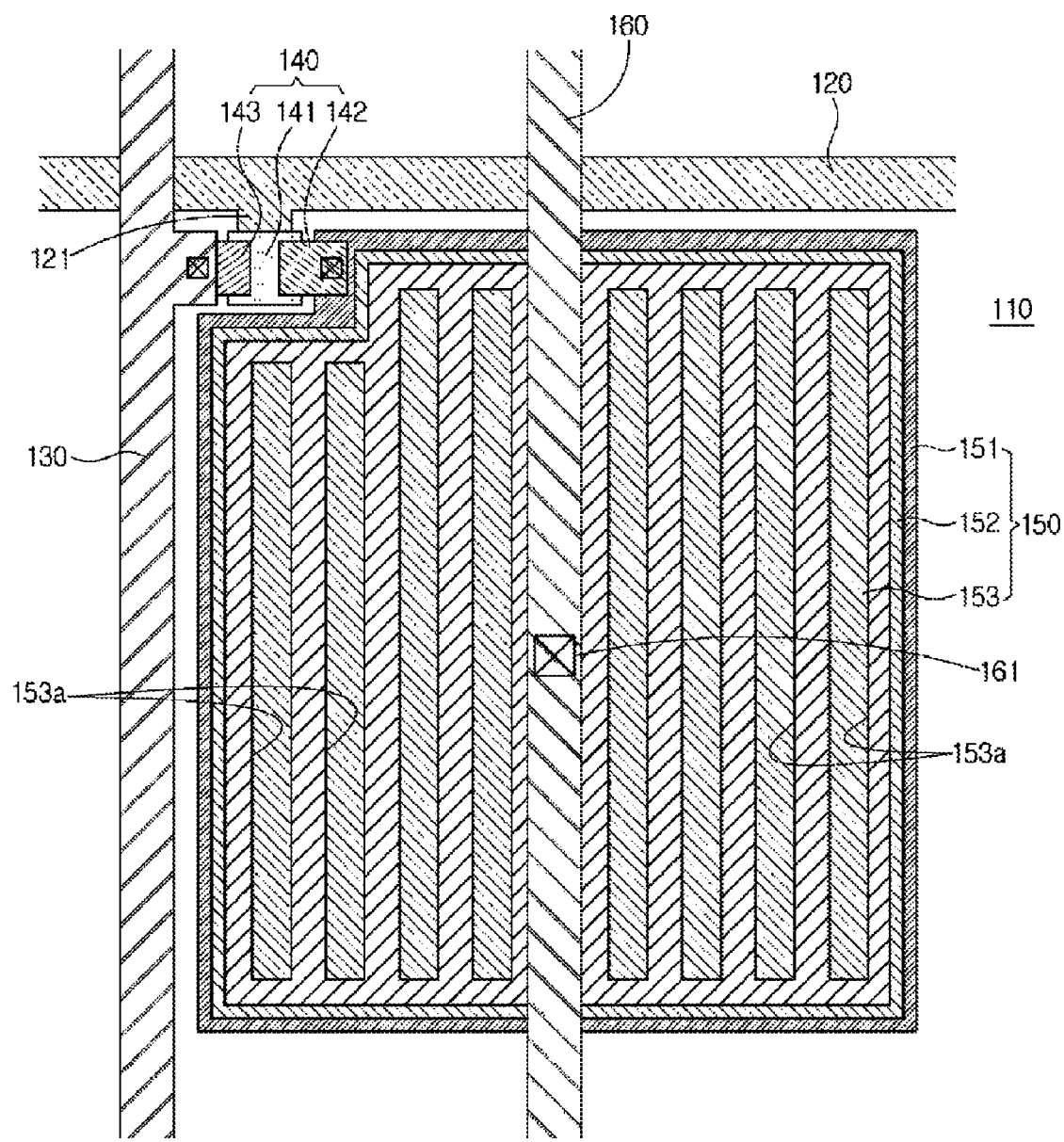
FIG. 3 is a fragmentary, schematic top plan view illustrating a digital x-ray detector according to a first exemplary embodiment of the present disclosure.
Figure 4:
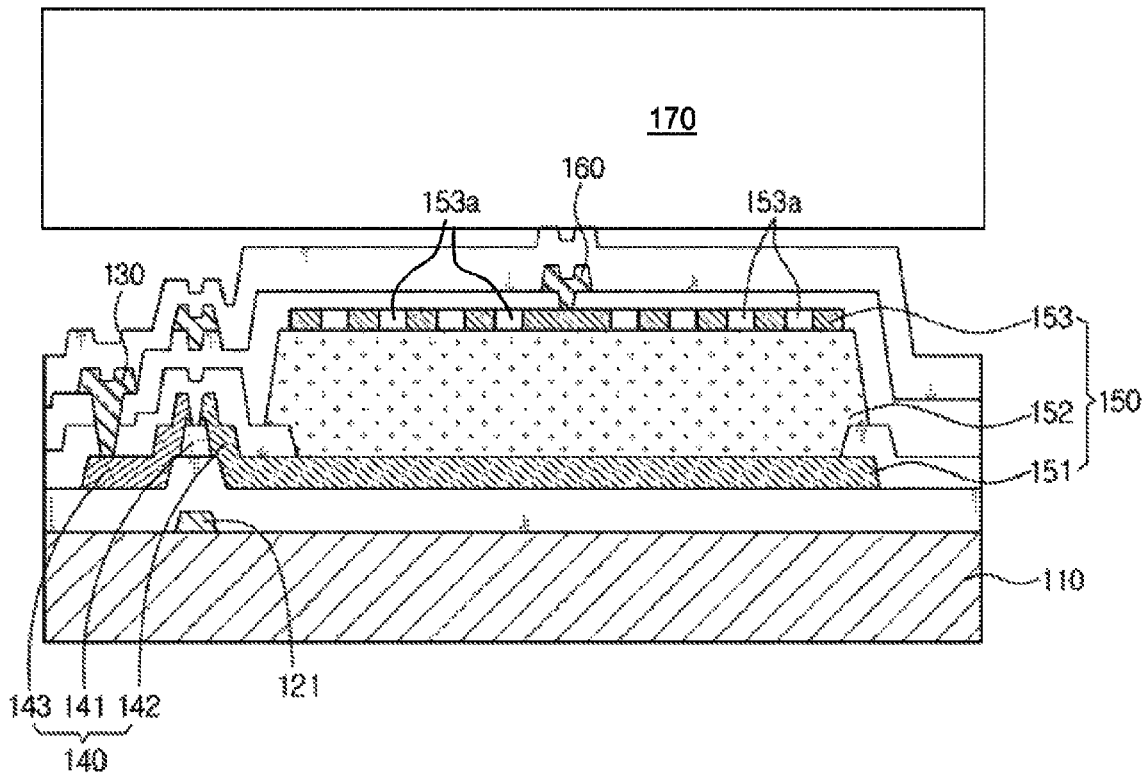
FIG. 4 is a fragmentary, schematic cross-sectional view of the digital x-ray detector of FIG. 3.

Referring now to the figures of the drawings in detail and first, particularly to FIG. 3, there is shown a schematic top plan view of a first exemplary embodiment of a digital x-ray detector of the first embodiment of the present disclosure, and FIG. 4 is a schematic cross-sectional view of the digital x-ray detector according to the first exemplary embodiment.

The digital x-ray detector according to the first embodiment illustrated in FIGS. 3 and 4 includes a substrate 110, a gate line 120, a data line 130, a thin film transistor 140, a PIN diode 150, a bias line 160 and a scintillator (not illustrated).

The gate line 120 is disposed on the substrate 110 in a first direction, for example, a horizontal direction of the figure, and the data line 130 is disposed on the substrate 110 in a second direction that is perpendicular to the first direction, for example, a vertical direction. That is, the gate line 120 and the data line 130 are disposed such that they intersect each other and form a pixel domain.

The thin film transistor 140 is disposed within the pixel domain such that it is adjacent to where the gate line 120 and the data line 130 intersect each other, and the thin film transistor 140 includes a gate electrode 121 protruding from one side of the gate line 120, an active layer 141 formed above the gate electrode 121, a drain electrode 143 protruding from one side of the data line 130 and super posed on one side of the active layer 141, and a source electrode 142 superposed on the other side of the active layer 141.

Herein, the gate electrode 121 extends from the gate line 120. Therefore, the gate electrode 121 may be made of a same substance and in the same process as the gate line 120.

The active layer 141 is formed on the gate electrode 121 and below the source electrode 142 and drain electrode 143, and may include an ohmic contact layer doped with an impurity formed on a region where it contacts the source electrode 142 and drain electrode 143. That is, the active layer 141 is formed on a middle layer between the gate electrode 121, and the source electrode 142 and drain electrode 143 to serve as a channel through which electrons move.

The source electrode 142 is formed on one side of the active layer 141 and is electrically connected to the PIN diode 150. Therefore, an electronic signal converted at the PIN diode 150 is transmitted to the active layer 141 through the source electrode 142 of the thin film transistor 140.

The drain electrode 143 is formed on the other side of the active layer 141 that faces the source electrode 142. The drain electrode 143 may be electrically connected to the data line 130 through a predetermined contact hole. Therefore, the electronic signal goes through the drain electrode 143 of the thin film transistor 140 and through the data line 130 connected to the drain electrode 143, and is then displayed as an image signal.

The PIN diode 150 is electrically connected to the source electrode 142 of the thin film transistor 140. The PIN diode 150 converts the visible ray into an electronic signal and transmits the converted electronic signal to the source electrode 142.

The PIN diode 150 includes a lower electrode 151 electrically connected to the source electrode 142, a PIN layer 152 formed on the lower electrode 151, and an upper electrode 153 formed on the PIN layer 152. The PIN layer 152 serves to convert the visible ray into the electronic signal. Specifically, the PIN layer 152 includes a P (Positive) type semiconductor layer, an I (Intrinsic) type semiconductor layer, and an N (Negative) type semiconductor layer, and the N type semiconductor layer, the I type semiconductor layer, and the P type semiconductor layer may be deposited successively on the lower electrode 151. When a visible ray is emitted to such a PIN layer 152, the I type semiconductor layer is depleted by the P type semiconductor layer and the N type semiconductor layer, and generates an electric field inside thereof. A positive hole and electron generated by the ray are drifted by the electric field and then collected in the P type semiconductor layer and N type semiconductor layer, respectively.

The bias line 160 may be electrically connected to the upper electrode 153 of the PIN diode 150 through a predetermined contact hole 161.

The scintillator (not illustrated) is formed on the PIN diode 150, and serves to convert an x-ray into a visible ray.

According to the exemplary embodiment of the present disclosure, on the upper electrode 153 of the PIN diode 150, a plurality of aperture holes 153a each having a slit shape are formed parallel to one another. Specifically, the aperture holes 153a are formed in a slit shape extending in a second direction (Y axis), each disposed by a predetermined distance to one another in a first direction (X axis). Such aperture holes 153a are holes formed such that they penetrate a plate surface of the upper electrode 153 and, thus, an area of the upper electrode 153 is reduced as much as an area occupied by the penetration holes 153a.

As mentioned above, the size of an area of the upper electrode 153 that forms the PIN diode 150 is closely related to the capacitance of the PIN diode 150. That is, the capacitance (C) of the PIN diode 150 is proportional to a dielectric constant ($\in$) of the dielectric and the size of an area (A) of the upper electrode 53, and is inversely proportionate to a distance (l) between the upper electrode 153 and the lower electrode 151.

Therefore, by reducing the size of an area of the upper electrode 153 using the aperture holes 153a, the capacitance of the PIN diode 150 may be reduced and, thus, it is possible to improve the reaction velocity of the digital x-ray detector. Such a digital x-ray detector with improved reaction velocity may be used for videos.

Furthermore, because the upper electrode 153 made of a transparent conductive substance, such as ITO, absorbs or reflects the visible ray being provided from the scintillator, it may be the reason for deteriorating the photo-electron signal conversion efficiency on the PIN layer 152. However, the penetration holes 153a formed on the upper electrode 153 transmit the ray being provided from the scintillator 170 to the PIN diode 150, onto the PIN layer 152 directly as it is, thereby increasing an amount of ray entering the PIN layer 152. Therefore, the photo-electron signal conversion efficiency of the PIN diode 150 increases in proportional to the size of an area of the penetration holes 153a.

Such aperture holes 153a of the upper electrode 153 are holes patterned together with the upper electrode 153 in a photo process wherein the upper electrode 153 is formed and, thus, there does not need to be a further process for forming the aperture holes 153a.

Hereinafter, a digital x-ray detector according to a second exemplary embodiment of the present disclosure will be explained.

Figure 5:
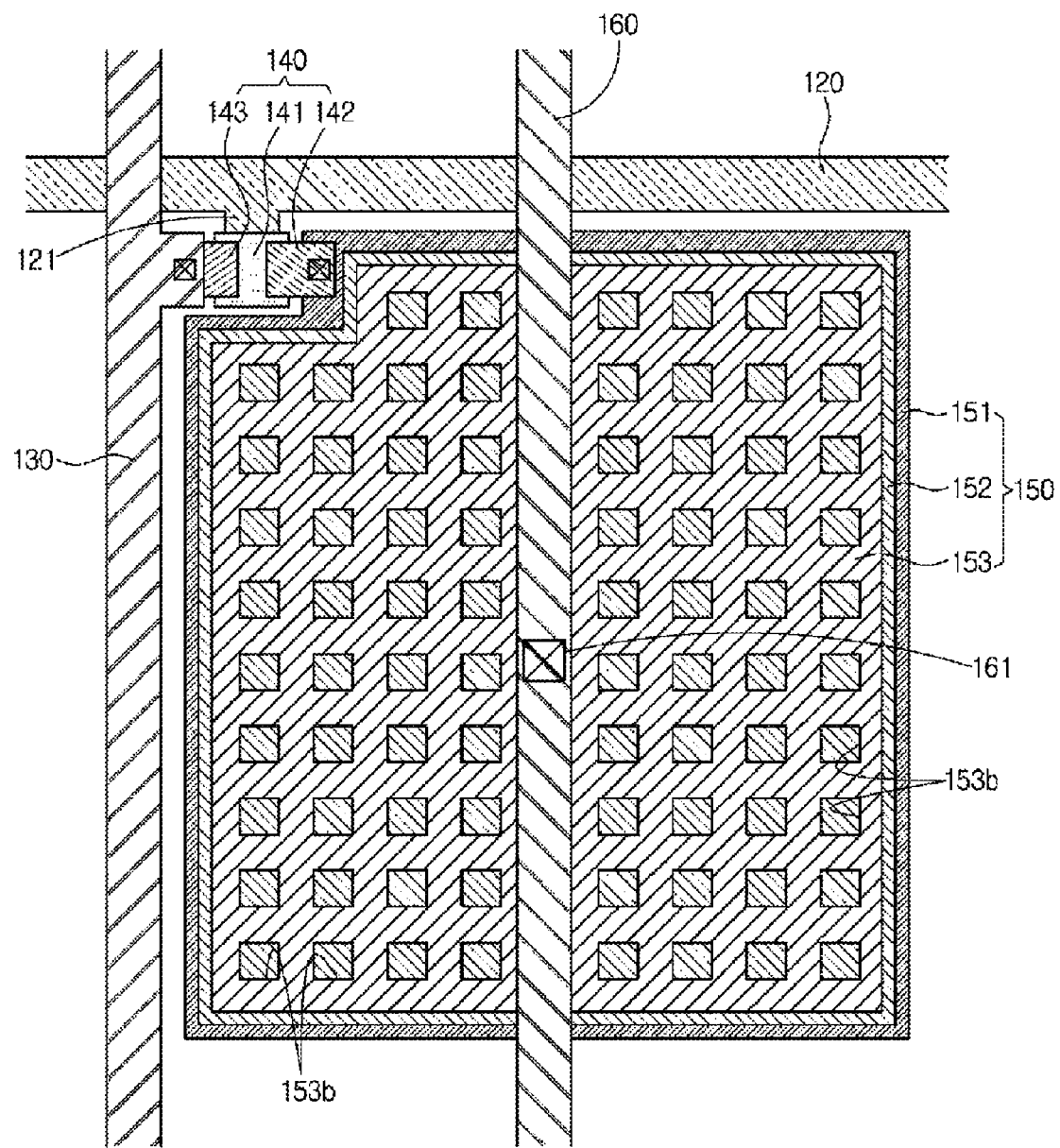
FIG. 5 is a fragmentary, schematic top plan view illustrating a digital x-ray detector according to a second exemplary embodiment of the present disclosure.

FIG. 5 is a schematic top plan view illustrating a digital x-ray detector according to the second embodiment of the present disclosure.

In the digital x-ray detector according to the second embodiment illustrated in FIG. 5, a plurality of aperture holes 153b of the upper electrode 153 are formed, each having a dot shape disposed in a matrix format, which is different from the first embodiment.

Forming the aperture holes 153b in a dot shape and disposing them in a matrix format on an entirety of surface of the upper electrode 153 not only has an effect of improving the reaction velocity and photo-electron signal conversion efficiency of the PIN diode 150, but also prevents the electrical characteristics of the upper electrode 153 from deteriorating.

Meanwhile, in the aforementioned embodiments, the aperture holes 153a, 153b were formed in a slit or dot shape, but there is no limitation to such shapes. Thus, the aperture holes 153a, 153b may have different shapes depending on the environments where they are to be used or on different designing conditions.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

REFERENCE NUMERALS

110: SUBSTRATE
120: GATE LINE
121: GATE ELECTRODE
130: DATA LINE
140: THIN FILM TRANSISTOR
141: SOURCE ELECTRODE
142: ACTIVE LAYER
143: DRAIN ELECTRODE
150: PIN DIODE
151: LOWER ELECTRODE
152: PIN LAYER

153: UPPER ELECTRODE
153A, 153B: APERTURE HOLE
160: BIAS LINE
161: CONTACT HOLE

It is noted that various individual features of the inventive processes and systems may be described only in one exemplary embodiment herein. The particular choice for description herein with regard to a single exemplary embodiment is not to be taken as a limitation that the particular feature is only applicable to the embodiment in which it is described. All features described herein are equally applicable to, additive, or interchangeable with any or all of the other exemplary embodiments described herein and in any combination or grouping or arrangement. In particular, use of a single reference numeral herein to illustrate, define, or describe a particular feature does not mean that the feature cannot be associated or equated to another feature in another drawing figure or description. Further, where two or more reference numerals are used in the figures or in the drawings, this should not be construed as being limited to only those embodiments or features, they are equally applicable to similar features or not a reference numeral is used or another reference numeral is omitted.

The foregoing description and accompanying drawings illustrate the principles, exemplary embodiments, and modes of operation of the systems and methods. However, the systems and methods should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments can be made by those skilled in the art without departing from the scope of the systems and methods as defined by the following claims.

What is claimed is:

1. A digital x-ray detector, comprising:
   a substrate;
   a gate line and a data line formed on the substrate such that the gate line and the data line intersect each other to form a pixel domain;
   a thin film transistor formed within the pixel domain such that the thin film transistor is adjacent to a portion where the gate line and the data line intersect each other, the thin film transistor including a gate electrode, an active layer, a source electrode, and a drain electrode;
   a PIN diode formed within the pixel domain and including:
      a lower electrode connected to the source electrode of the thin film transistor;
      a PIN layer formed on the lower electrode; and
      an upper electrode formed on the PIN layer and defining an aperture hole through which a visible ray incident on the PIN diode is transmitted directly to the PIN layer; and
   a bias line connected to the upper electrode of the PIN diode.

2. The detector according to claim 1, wherein:
   the aperture hole is a plurality of aperture holes each having a slit shape extending in one direction; and
   the aperture holes are parallel to one another.

3. The detector according to claim 1, wherein:
   the aperture hole is a plurality of aperture holes each having a dot shape; and
   the aperture holes are in a matrix format.

* * * * *